(12) United States Patent
Boll et al.

(10) Patent No.: US 7,976,736 B2
(45) Date of Patent: Jul. 12, 2011

(54) PROCESS FOR PREPARING SILVER-CONTAINING AQUEOUS FORMULATION USEFUL FOR ELECTRICALLY CONDUCTIVE OR REFLECTIVE COATINGS

(75) Inventors: Matthias Boll, Köln (DE); Stefanie Eiden, Leverkusen (DE); Johan Kijlstra, Odenthal (DE)

(73) Assignee: Bayer MaterialScience AG, Leverkuse (DE)

( * ) Notice: Subject to any disclaimer, the term of this patent is extended or adjusted under 35 U.S.C. 154(b) by 0 days.

(21) Appl. No.: 12/814,050

(22) Filed: Jun. 11, 2010

(65) Prior Publication Data
US 2010/0252784 A1    Oct. 7, 2010

Related U.S. Application Data

(62) Division of application No. 11/923,887, filed on Oct. 25, 2007, now Pat. No. 7,824,580.

(30) Foreign Application Priority Data

Oct. 25, 2006 (DE) .......................... 10 2006 050 380
Aug. 6, 2007 (DE) .......................... 10 2007 037 079

(51) Int. Cl.
*H01B 1/02* (2006.01)
*C01G 3/00* (2006.01)
(52) U.S. Cl. .......................................... 252/514; 423/23
(58) Field of Classification Search ....... 252/500–521.6; 423/23
See application file for complete search history.

(56) References Cited

U.S. PATENT DOCUMENTS

| 4,670,188 | A | 6/1987 | Iwasa et al. |
|---|---|---|---|
| 5,882,722 | A | 3/1999 | Kydd |
| 6,036,889 | A | 3/2000 | Kydd |
| 6,881,239 | B2 | 4/2005 | Uchida |
| 2004/0147618 | A1 | 7/2004 | Lee et al. |
| 2004/0178391 | A1 | 9/2004 | Conaghen |
| 2005/0078158 | A1 | 4/2005 | Magdassi et al. |
| 2006/0001726 | A1 | 1/2006 | Kodas et al. |
| 2006/0159603 | A1 | 7/2006 | Vanheusden et al. |
| 2006/0197064 | A1* | 9/2006 | Pan et al. ............... 252/500 |
| 2007/0281136 | A1 | 12/2007 | Hampden-Smith et al. |
| 2008/0034921 | A1 | 2/2008 | Vanheusden et al. |
| 2008/0236444 | A1 | 10/2008 | Enciu et al. |

FOREIGN PATENT DOCUMENTS

| EP | 1 493 780 A1 | 1/2005 |
|---|---|---|
| EP | 1712635 A1 | 10/2006 |
| KR | 102004047100 | * 6/2004 |

(Continued)

OTHER PUBLICATIONS

Mulder, "Basics Principles of Membrane Technology", p. 293, available at http://books.google.com, (1996).

*Primary Examiner* — Mark Kopec
*Assistant Examiner* — Jaison P Thomas
(74) *Attorney, Agent, or Firm* — Norris McLaughlin & Marcus PA

(57) ABSTRACT

Process for preparing A silver-containing, disperse, water-containing formulation useful for producing electrically conductive and/or optically reflective coatings, which comprises (i) reacting a silver salt solution with a solution containing hydroxide ions, wherein at least one of said solutions comprises a polymeric dispersant, to produce an $Ag_2O$ sol, (ii) reacting the $Ag_2O$ sol obtained from step i) with a reduction agent, and (iii) purifying the solution obtained from step ii).

7 Claims, 1 Drawing Sheet

FOREIGN PATENT DOCUMENTS

| | | |
|---|---|---|
| WO | 99/45077 A1 | 9/1999 |
| WO | 03 032084 A2 | 4/2003 |
| WO | 03032084 A | 4/2003 |
| WO | 2003 038002 | 5/2003 |
| WO | 03038002 A | 5/2003 |
| WO | 03045584 A1 | 6/2003 |
| WO | 2006/066033 A1 | 6/2006 |
| WO | 2006 072959 A1 | 7/2006 |

\* cited by examiner

PROCESS FOR PREPARING SILVER-CONTAINING AQUEOUS FORMULATION USEFUL FOR ELECTRICALLY CONDUCTIVE OR REFLECTIVE COATINGS

This application is a division of application Ser. No. 11/923,887, filed Oct. 25, 2007, now U.S. Pat. No. 7,824,580, issued Nov. 2, 2010.

The present invention relates to finely divided metal particles and metal suspensions for the production of electrically conductive layers.

BACKGROUND OF THE INVENTION

Although plastics structural components generally possess good mechanical and in some cases also good optical properties (such as for example transparency in the case of polycarbonate), most industrial plastics are electrical insulators.

The combination of mechanical properties such as stability, optical properties such as transparency and electrical properties such as electrical conductivity in the case of transparent plastics can provide enormous advantages for a wide range of applications. Foremost among these is the transparency of components, which should be as high as possible in many areas of application, for example for windows for the automobile construction industry or for use in buildings, or for inspection windows in instruments that are intended to be coupled with extended electrical applications (electrical heating, screening electromagnetic radiation, dissipation of surface charge). At the same time, in most cases the mechanical stability of the basic material, and also the freedom of design with regard to the ultimate shape, should be as high as possible. Since the line width can be chosen to be very small, use in the field of solar cell technology (photovoltaic units) as highly conductive electrical conductors is also a real possibility. The advantages in this case are the result of the low surface covering due to the presence of the electrical conductor on the face turned towards the source of light.

By using inks filled with metal particles in the nanometre range, thin electrical conductive strips with virtually any geometry at all can be printed for example on plastic films, for example using ink-jet technology. In this case it is especially desirable that the line width of such conductor strips should be about 20 µm, or even less. At around this limit structures are generally very difficult to detect with the human eye and no troublesome optical effect is produced in transparent components.

A further possible method of producing conductor strips having the fineness described above, i.e. which are visually difficult to detect or cannot be detected at all on surfaces (structures with a line width <20 µm), in particular on polymeric substrates, is to provide the substrate in a pre-treatment step with the necessary structuring in order subsequently to fill the resultant structuring with the conducting material.

However, the following further requirements must also be satisfied if possible, though not all of these can be met with the hitherto known inks.

The electrical conductor strips must be heat-resistant (i.e. stable up to 400° C. for short periods) and also mechanically flexible, the metal particle inks used to produce them should permit the production of strips with a line thickness of 100 µm and less (down to 20 µm), and they should be more convenient and easier to process than known conductive pastes. This means that the paste must have a significantly lower viscosity if ink-jet methods are to be used, and must also have a suitable wetting and spreading capacity and contain smaller particles than conventional conductive pastes. In particular the wetting behaviour and spreading capacity must be taken into account in connection for the aforementioned possibility of filling the depressions of pre-structured surfaces. For such a special use the ink should have, in addition to the properties specified above, also a low contact angle (<45° C.) on the selected substrate and/or as large a surface tension as possible (>10 mN/m).

In particular a specific electrical conductivity of the printed, dried and thermally treated ink of significantly better than $10^2$ $\Omega^{-1}\cdot cm^{-1}$ should also be achieved. The thermal treatment should in particular be carried out at a maximum temperature of 140° C., i.e. the softening point of for example polycarbonate. In addition the conductor strips that are formed should be as mechanically flexible as possible so that they retain the conductivity even when the material expands. In particular the conductor strips should also exhibit a particularly good adhesion to commonly used substrates, especially to polycarbonate.

A very specific requirement placed on such an ink is that the particle size of the metal particles should be significantly less than 20 µm and that the ink should have a low viscosity (less than 150 mPa·s). It also appears to be advantageous if the particles employed in the formulation form close packing arrangements after the printing procedure, which already at low concentrations and low processing temperatures lead to the desired conductivity of the printed structure.

A further special alternative object consists in finding, for the material polycarbonate, a suitable way of producing as simply as possible reflecting surfaces on three-dimensional structures of the polycarbonate. A conventional process used hitherto for this purpose is for example sputtering (physical vapour deposition, PVD) with aluminium or other metals that can be vaporised or atomised under these conditions, though this has disadvantages when covering three-dimensional structures with a reflective coating (non-uniform covering of the matrix to be sputtered), and also requires the use of relatively complicated apparatus (working under reduced pressure, use of vacuum techniques and pressure locks). Furthermore, the PVD and atomisation processes have disadvantages as regards the strength of adhesion of the sputtered layer on the substrate. Thus, the metal layers that are produced cannot be touched directly without first applying a protective lacquer, since this would destroy the layers.

R. W. Vest (Metallo-organic materials for Improved Thick Film Reliability, Nov. 1, 1980, Final Report, Contract No. N00163-79-C-0352, National Avionic Center) describes a printable formulation for conductor strips, but the temperature required here to produce a conductivity is 250° C., i.e. well above the possible application temperature for many industrial plastics.

U.S. Pat. No. 5,882,722 and U.S. Pat. No. 6,036,889 describe a conductive formulation that contains metallic particles, a precursor and an organic solvent and that forms conductive structures only at a temperature of 200° C. and above. Also the viscosity of the formulation in this case is so high that basically this formulation cannot be processed in an ink-jet printer.

Formulations based on readily decomposable silver compounds as low-viscosity solutions with a low sintering temperature are the subject of the document WO 03/032084 (A2). Low decomposition temperatures are also disclosed here, but the specific conductivities of the structure obtained are not mentioned. The lowest temperature at which a conductive coating can be achieved using a silver formulation is cited as 185° C.

The specifications WO-2003/038002 A2 and US-A-2005/0078158 describe formulations with silver nanoparticles, which are stabilised inter alia with sodium cellulose methylcarboxylic acid. Although these specifications describe the necessity for a post-treatment, for example by heat or flocculating agents, they do not disclose any processing temperatures nor the conductivity of the microstructures obtained from the formulation. In addition the exact distribution of the used and obtained nanoparticles is not disclosed, although the size range should be less than 100 nm. The content of the disclosed formulations is not more than 1.2 wt. %. It is however indicated that proportions of 60-74 wt. % might be possible. It is also stated that these are not suitable for ink-jet printing due to the sharp increase in viscosity of the resultant formulation. An upper limit of the content in connection with which a use of the ink would still be possible is not disclosed.

In WO 2006/072959 A2 a method is disclosed for obtaining metal nanoparticles which could be used for example for ink-jet printing. In this connection nanoparticles of sizes less than 20 nm and of unknown size distribution are obtained. A bimodal distribution is not disclosed. The usable contents of the resulting formations are in the range from 0.5 to 80 wt. %. Furthermore, it is disclosed that in the production process a preliminary reduction of silver acetate by means of water-soluble polymers is necessary in order to prevent, inter alia, the agglomeration of the obtained nanoparticles. It is therefore obvious that also in the resulting formulation the polymers employed for the preliminary reduction still interact with the particles or are bound to the latter, in order that the effect described above can be retained.

Overall a more complicated process up to the formulation of an ink is disclosed, including a preliminary reduction, main reduction, concentration by evaporation and final formulation, which means that a large-scale, cost-efficient applicability cannot be assumed.

Another route for forming colloidal metal nanoparticles is disclosed in US-2004/0147618. Monomodal distributions of metallic nanoparticles in sizes between 2 and 10 nm are obtained, by dissolving a metal salt together with a water-soluble polymer in a solvent and treatment with radiation under a protective gas (e.g. nitrogen or argon). The use of the obtained dispersion as an ink is mentioned. However, no formulation for such an ink is disclosed. In particular, the amounts of metal particles that can be used in practice in an ink formulation are not given. Also, in this case too the production of the ink by working under a protective gas is very complicated for a large-scale process.

In order to achieve a low sintering temperature, a mixture of silver and gold nanoparticles is employed in WO 2005/0136638. Good conductivity is mentioned here starting from a sintering temperature of 200° C.

The document EP 1 493 780 A1 describes a silver paste that is a very good conductor after thermal treatment at 150° C., though this formulation is too highly viscous for it to be able to be used in ink-jet printing.

The Cabot company offers the product "Cabot Inkjet Silver Conductor AG-IJ-G-100-S1", which is a silver conductive ink that can be applied using ink jet technology. Tests on adhesion to plastics such as polycarbonate are not mentioned in the existing documents.

The HARIMA company offers the product line "NP Series Nano-Paste", which is a silver conductive ink based on nanoparticles and having a low viscosity. However, HARIMA specifies sintering temperatures of 210° C.-230° C. The processing temperature means that the paste is unsuitable for the printing of polymers.

SUMMARY OF THE INVENTION

The objects mentioned above can be achieved using the silver-containing formulation described below. In particular, articles made of polycarbonate can be coated uniformly with a thin glossy layer of particularly firmly adherent silver in a particularly simple and cost-effective manner, for example by dipping or casting followed by thermal treatment. Furthermore, it is possible with a formulation according to the invention to produce on pre-constructed surfaces conductor strips (width <20 µm, for example on polycarbonate) which are difficult to detect visually or cannot be detected at all, by filling the structure cavities.

From the economic aspect, the smallest possible concentration of silver in the lacquer used and thin layers are preferred here because even a very thin layer of silver is sufficient to produce an unbroken reflecting layer and silver is a costly raw material for such a formulation.

DETAILED DESCRIPTION

Figure 1:
FIG. 1 illustrates a microphotograph of a coating according to the invention on polycarbonate after a scratch test.

The particular object mentioned above, that of printing plastics, is solved e.g. by using a silver-containing formulation that can be applied with a printer, for example a piezo-inkjet printer, onto a substrate, for example polycarbonate, and which is heated after or during application (or both) so that a layer with the desired electrical conductivity can be formed. This formulation preferably develops an electrical conductivity even at low post-treatment temperatures (<=140° C.), so that the production of electronic structures, e.g. on materials such as polycarbonate, is possible.

The postulated object of producing conductor strips that are visually difficult to detect or which cannot be detected at all can also be achieved in a similar manner by the purposeful formation of pre-structured surfaces in the strips and/or depressions.

The invention provides a silver-containing, disperse, water-containing formulation containing at least
a) 0.5 to 30 parts by wt. of silver metal particles with an effective diameter of at most 150 nm, preferably at most 100 nm, particularly preferably 40 to 80 nm, determined using laser correlation spectroscopy, in which the size distribution of the particles is bimodal,
b) 50 to 99.5 parts by wt. of water and optionally solvent up to 30 parts by wt.,
c) 0.01 to 10 parts by wt. of at least one, in particular polymeric, dispersant,
d) 0 to 5 parts by wt. of film-producer and optionally
e) 0 to 5 parts by wt. of additives,
f) 0 to 5 parts by wt. of conductive polymers,
characterised in that the formulation has a viscosity of at most 150 mPa·s.

In the case of the application to pre-structured substrates, the formulation is furthermore characterised in that it forms as low a contact angle as possible with the substrate (i.e. <45° on polycarbonate) and has as high a surface tension as possible (>10 mN/m). Preferably in this case the contact angle is less than 30° and/or the surface tension of the formulation is greater than 20 mN/m. Particularly preferably the contact angle in this case is below 10° and/or the surface tension of the formulation is greater than 40 mN/m. The contact angle is measured on polycarbonate at 25° C. and under normal conditions.

The sum of the parts by weight of the components of the formulation is in particular 100 parts by weight.

The determination of size using laser correlation spectroscopy is known from the literature and is described e.g. in T. Allen, Particle Size Measurements, vol. 1, Kluver Academic Publishers, 1999.

The dispersant preferably comprises at least one agent chosen from the group: alkoxylates, alkylolamides, esters, amine oxides, alkyl polyglucosides, alkylphenols, arylalkylphenols, water-soluble homopolymers, water-soluble random copolymers, water-soluble block copolymers, water-soluble graft polymers, in particular polyvinyl alcohols, copolymers of polyvinyl alcohols and polyvinyl acetates, polyvinyl pyrrolidones, cellulose, starch, gelatine, gelatine derivatives, polymers of amino acids, polylysine, polyaspartic acid, polyacrylates, polyethylene sulfonates, polystyrene sulfonates, polymethacrylates, condensation products of aromatic sulfonic acids and formaldehyde, naphthalene sulfonates, lignin sulfonates, copolymers of acrylic monomers, polyethylenimines, polyvinylamines, polyallylamines, poly(2-vinylpyridines), block copolyethers, block copolyethers with polystyrene blocks and/or polydiallyldimethylammonium chloride.

The dispersant is particularly preferably chosen from the set: polyvinylpyrrolidone, block copolyethers and block copolyethers with polystyrene blocks. Polyvinylpyrrolidone with a molecular weight of about 10000 amu (e.g. PVP K15 from Fluka) and polyvinylpyrrolidone with a molecular weight of about 360000 amu (e.g. PVP K90 from Fluka) are most particularly preferred, and block copolyethers with polystyrene blocks with 62 wt. % of $C_2$-polyether, 23 wt. % of $C_3$-polyether and 15 wt. % of polystyrene, with respect to the dried dispersant, with a ratio of the block lengths $C_2$-polyether to $C_3$-polyether of 7:2 units (e.g. Disperbyk 190 from BYK-Chemie, Wesel) are particularly preferably used.

A solvent b) is used that is particularly preferably chosen from the set: $C_1$- to $C_5$-alcohols, in particular $C_1$- to $C_3$-alcohols, ethers, in particular dioxalan, ketones, in particular acetone.

The film-producer d) is preferably chosen from the set: polydimethylsiloxane, polyacrylate, ammonium salts of polyacrylates, siloxanes, wax combinations, copolymers with pigment-active groups, low molecular weight polymers, hydroxyethyl cellulose, polyvinylalcohol, or from the group of dispersants mentioned above, particularly preferably here e.g. the dispersant BYK 356 from BYK-Chemie, Wesel, a polyacrylate, as well as BYK 154 from the same company which is the ammonium salt of an acrylate copolymer.

The additive e) is preferably chosen from the set: pigments, antifoam agents, light stabilisers, optical brighteners, corrosion inhibitors, antioxidants, algicides, plasticisers, thickeners, surface-active substances. Pluronic PE10400 (From BASF, Ludwigshafen), a triblock copolymer of $C_3$-polyether, $C_2$-polyether, $C_3$-polyether units with 40 wt. % of the $C_2$-polyether is most particularly preferably used as additive.

The conductive polymer f) is preferably chosen from the set: polypyrrole, polyaniline, polythiophene, polyphenylenevinylene, polyparaphenylene, polyethylene-dioxythiophene, polyfluorene, polyacetylene, particularly preferably polyethylene-dioxythiophene in combination with polystyrene sulfonic acid.

A particularly preferred formulation is characterised in that the silver particles a) have an effective particle diameter of 10 to 150 nm, preferably 40 to 80 nm, determined by laser correlation spectroscopy.

The silver particles a) are preferably present in the formulation in a proportion of 1 to 20 parts by weight, particularly preferably 2 to 6 parts by weight.

The concentration of dispersant c) is preferably 0.02 to 5 parts by weight, particularly preferably 0.04 to 2 parts by weight.

A particularly advantageous formulation is obtained by subjecting the silver sol to membrane filtration with a filter fineness of at most 100,000 Da, for purification and concentration purposes.

The invention also provides for the use of the formulation according to the invention to produce electrically conductive and/or optically reflective coatings, in particular conductor strips with a line width of less than 100 μm, preferably less than 80 μm. The invention also provides a process for producing conductor strips with a line width of less than 100 μm, preferably less than 80 μm, characterised in that the new formulation is printed onto a substrate surface using inkjet technology and is thermally treated, in particular at a temperature of at most 140° C., to remove residual water and optionally solvents, as well as optionally to sinter the silver particles present.

The present invention in addition provides a process for producing conductor strips with a line width of less than 20 μm, in which the new formulation is introduced into the predetermined structurings in the substrate, wherein the structuring has a line width of <20 μm and the applied formulation is thermally treated, in particular at a temperature of at most 140° C., to remove water and optionally solvent.

The invention also provides a substrate, in particular a transparent plastics substrate having an electrically conductive and/or optically reflective coating that is obtainable from a formulation according to the invention.

Particularly preferred is a substrate that is characterised in that the electrically conductive coating comprises conductor strips with a line width of less than 100 μm, preferably less than 80 μm, wherein the conductivity in the conductor strips is at least $7·10^6$ S/m.

The new formulation comprises, as described above, silver particles with a bimodal size distribution. It was surprisingly found that the bimodal distribution is advantageous for a formation of conductive structures already at relatively low contents of the silver nanoparticles. It can be assumed that this is due to the fact that the interstices formed between the larger particles are filled by smaller particles. In this way larger continuous connected contact surfaces are formed in the thermal post-treatment of the ink. Thus, the resulting formulation at a lower mass content has the same conductivity of an ink with an approximately monodisperse distribution at approximately the same effective diameter, or has a higher conductivity with the same mass content and the same effective diameter.

The requirements described above are furthermore satisfied by a formulation that contains silver nanoparticles, solvent, film-producer, dispersant and possibly other additives. It preferably contains small silver nanoparticles that substantially have an effective diameter of 75 nm with a bimodal distribution in a low concentration of 0.5 to 20 wt. %, preferably 2 to 5 wt. %, which means that only a small amount of dispersant is needed. Presumably also this is why a low post-treatment temperature of 140° C. is sufficient to produce high conductivities. The formulation can be applied to polycarbonate, for example by inkjet printing technology, or by immersion, flooding or casting methods, then dried and conditioned at 140° C. for several hours. Very adherent, electronically conductive structures or, in the case of application to two-dimensional surfaces, optically reflective layers, both of which adhere extremely well to polycarbonate, are then obtained.

The silver sols preferably used in the formulation are prepared from $Ag_2O$ by reduction with a reducing agent such as aqueous formaldehyde solution (FA), following the addition of a dispersant. For this purpose the $Ag_2O$ sols are produced batchwise, for example by rapidly mixing the silver nitrate solution with NaOH by rapid agitation, or in a continuous process using a micromixer in accordance with German patent application 10 2006 017 696, corresponding to U.S. 2009/0263496, the disclosure of which is incorporated herein by reference. Then the $Ag_2O$ nanoparticles are reduced using FA in excess in a batchwise procedure and the product is then purified by centrifuging or by membrane filtration, preferably by membrane filtration. This procedure is particularly preferred since the amount of organic auxiliary substances bound to the surface of the silver nanoparticles can in this way be kept low and furthermore a bimodal size distribution can be obtained. In particular no pre-treatment steps, for example a prior reduction in the presence of polymers, or further post-treatment steps apart from addition of energy, for example activation of a precursor system, or flocculation, are needed in this case.

Furthermore, it was surprisingly found that the content of dispersant c) in the silver dispersion after diafiltration or centrifuging has a decisive influence on the conductivity of the structures produced.

Figure 2:
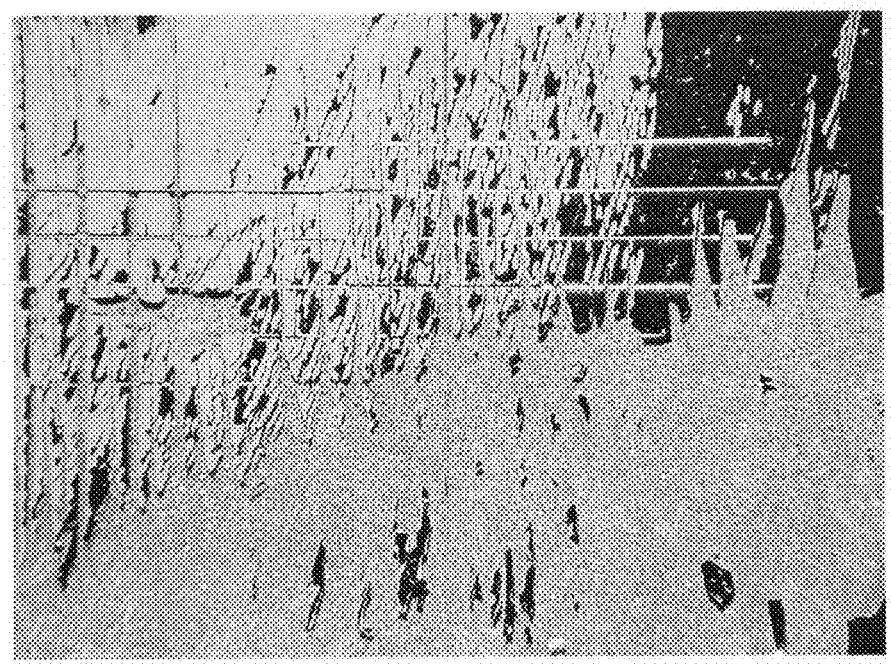
FIG. 2 illustrates a microphotograph of a coating according to the prior art after a scratch test.

The invention is explained in more detail below, with reference to the figures. FIG. 1 shows the microphotograph of a coating according to the invention on polycarbonate after a scratch test. FIG. 2 shows a microphotograph of a coating according to the prior art after a scratch test.

EXAMPLES

Example 1

Preparation of Silver Particles with Purification by Centrifuging

A mixture of a 0.054 molar caustic soda solution and the dispersant Disperbyk 190 (manufacturer: BYK Chemie) (1 g/l) in a volume ratio of 1:1 was added to a 0.054 molar silver nitrate solution and stirred for 10 minutes. A brown $Ag_2O$ nanosol was produced. An aqueous 4.6 molar formaldehyde solution was added to this reaction mixture while stirring, so that the molar ratio of Ag* to reducing agent was 1:10. This mixture was heated to 60° C., kept at this temperature for 30 minutes and then cooled. The particles were purified by centrifuging (60 min at 30000 rpm) and redispersed in fully deionised water by applying ultrasound energy (1 min). This process was repeated twice. A colloidal-stable sol with a solids content of 5 wt. % (silver particles and dispersant) was obtained in this way. The yield was just under 100%. The silver dispersion contained 3 wt. % of Disperbyk 190, with respect to silver content, according to elemental analysis after centrifuging. An investigation using laser correlation spectroscopy gave an effective particle diameter of 73 nm.

Example 2

Preparation of Silver Particles with Purification by Membrane Filtration

A mixture of a 0.054 molar caustic soda solution and the dispersant Disperbyk 190 (manufacturer: BYK Chemie) (1 g/l) in a volume ratio of 1:1 was added to a 0.054 molar silver nitrate solution and stirred for 10 minutes. An aqueous 4.6 molar formaldehyde solution was added to this reaction mixture while stirring, so that the molar ratio of Ag* to reducing agent was 1:10. This mixture was heated to 60° C., kept at this temperature for 30 minutes and then cooled. In a first step the particles were separated from the unreacted feedstocks by diafiltration and then the sol was concentrated, a 30000 Dalton membrane being used for this purpose. A colloidal-stable sol with a solids content of 10 wt. % (silver particles and dispersant) was obtained. The proportion of Disperbyk 190 was 6 wt. %, with respect to the silver content, according to elemental analysis after membrane filtration. An investigation using laser correlation spectroscopy gave an effective particle diameter of 78 nm.

Example 3

Formulation of a Silver Ink 1 ml of a mixture of 99 parts by wt. of water, 1 part by wt. of dioxalan, 0.03 part by wt. of PVP K15 and 0.17 part by wt. of Disperbyk 190 was added to 1 ml of an 8 wt. % silver sol from Example 2 and thoroughly stirred in. One drop of this mixture was placed on PC and sintered for 1 h at 140° C. The relative electrical resistance of the drop was 0.1 ohm.

Example 4

Formulation of a Silver Ink 1 ml of a mixture of 92 parts by wt. of water, 8 parts by wt. of ethanol, 0.01 part by wt. of PVP K15 and 0.15 part by wt. of PVP K90 was added to 1 ml of an 8 wt. % silver sol from Example 2 and thoroughly stirred in. One drop of this mixture was placed on PC and heated for 1 h at 140° C. The relative electrical resistance of the drop was 0.1 ohm.

Example 5

Formulation of a Silver Ink 1 ml of a mixture of 90 parts by wt. of water and 10 parts by wt. of ethanol, 0.6 part by wt. of PVP K15 and 0.3 part by wt. of Pluronic PE 10400 was added to 1 ml of an 8 wt. % silver sol from Example 2 and thoroughly stirred in. The ink obtained was particularly good for printing onto PC using a piezo-ink-jet printer. The line obtained is kept at 140° C. for 17 hours in air. The specific conductivity then measured, $7 \times 10^6$ S/m, is a good ten percent of the electrical conductivity of metallic silver.

Example 6

Formulation of a Silver Ink (EID 1034 V14)

1 ml of a mixture of 99 parts by wt. of water and 1 part by wt. of ethanol, 0.01 part by wt. of PVP K90 and 0.04 part by wt. of Pluronic PE 10400 as well as 0.02 part by wt. of BYK 356 was added to 1 ml of an 8 wt. % silver sol from Example 2 and thoroughly stirred in. One drop of this mixture was placed on PC and sintered for 1 h at 40° C. The ink obtained was particularly good for insert moulding with polycarbonate.

Example 7

Formulation of a Silver Ink 1.5 ml of pure ethanol are added to 8.5 ml of an 18.5 wt. % silver sol from Example 2. For this purpose, 0.05 g of polyvinylpyrrolidone K15, together with 0.04 g of Pluronic PE 10400 and 0.03 g of BYK 348 are weighed out. The resultant formulation is thoroughly mixed so that a homogeneous brown-greyish dispersion is formed. The ink obtained is particularly suitable for producing lines that are difficult to detect visibly, i.e. with the naked eye, or which cannot be detected at all, on pre-structured polycarbonate. The structures on the polycarbonate are filled with the ink and dried for 17 hours at 140° C. The relative electrical resistance of a drop likewise formed from the ink was 0.1 ohm. The surface tension of the formulation was 22 mN/m.

Results
Strength of Adhesion

To test the strength of adhesion, polycarbonate films were coated by "flooding" with the silver dispersion being tested (also called the ink for short in the following), that is by inclining the film at an angle and allowing the inks from Examples 1 to 6 to run downwards over the untreated polycarbonate film. The films were then dried and stored for 17 hours at about 140° C. in air. The thickness of the coating obtained was about 1 µm (in the case of the ink from Example 1) and about 6 µm when using a commercially available comparison ink (Cabot Ink-jet Silver Conductor AG-U-G-100-S1). The greater thickness of the layer of comparison ink was the result of its higher solids content.

The strength of adhesion of the silver layer from the ink according to the invention according to Example 1 was compared with that of the silver layer from the commercially available ink in two ways. On the one hand, a so-called cross-hatch adhesion test was carried out: both coatings were cut right down to the substrate with a knife several times along parallel lines and then at right angles to these. Adhesive tape was then pressed onto the scratched sections and pulled off again. The image formed after pulling off the adhesive tape produces a purely qualitative result with respect to the strength of adhesion of the coating to the polycarbonate film. Here, the film coated with an ink according to Example 1 demonstrates, surprisingly, that the adhesion of the silver layer is substantially better (FIG. 1) than the adhesion of the silver layer from the ink according to the prior art (FIG. 2).

As another method for comparing the strength of adhesion of the silver layer from the ink according to Example 1 and the silver layer from the prior art, small metal pieces were glued to the surfaces lacquered with the inks. The metal pieces were rotated at a rate of 3° per minute and the torque required for the piece to come away from the support was measured.

Basically, two different types of fracture can be differentiated:—an adhesion fracture, when the ink comes away from the substrate, and a cohesion fracture, when the fracture takes place inside the silver layer because the adhesion between the substrate and the silver layer is greater than the forces acting within the silver layer. Basically, a cohesion fracture is an indication of good adhesion between the silver layer and the substrate.

Six samples from each of two silver layers were measured in the way described above using ink according to Example 1. The average value of the measurements showed that in the case of the ink from the prior art, an adhesion fracture occurred and that it took place on average at 1.26 Nm, while in the case of the ink according to Example 1, a cohesion fracture occurred, which took place on average at 4.24 Nm.

The thicknesses of the layers in the present case were about 6 µm for the ink according to the prior art and about 1 µm for the ink according to Example 1.

Specific Electrical Conductivity

Since the use of polycarbonate as a substrate for a conductive coating restricts the post-treatment temperature for producing an electrically conductive structure to about 140° C., such post-treatments can accordingly only be performed at low temperatures of up to at most 140° C. The highest possible electrical conductivity of the printed structures as the result of the lowest possible post-treatment temperature is of great importance for most commercial polymers.

The specific electrical conductivity of lines with a length of about 4 cm, of the inks according to Examples 1-5 and printed onto polycarbonate with an inkjet printer, was measured after 17 hours' post-treatment at about 140° C. For this purpose, the conductive cross-section of the lines was determined using a white light topography microscope. Four contacts were mounted with silver conductive glue at a spacing of 1 cm, 2 cm and 1 cm and the conductivity of the line was determined by a four-point measurement over a length of 2 cm.

Using the data for the cross-sectional area, this gave a specific conductivity for an ink according to Example 5 of $7 \times 10^6$ S/m (about 10% of the conductivity of solid silver), this also being greater than the value for the comparison ink from Cabot of about $4 \times 10^6$ S/m, also after pretreatment at about 140° C.

Insert Mouldability

Drops of ink from Example 6 are placed on a polycarbonate film (Makrofol). The drops obtained dry at room temperature and the dried ink is kept at 140° C. for 17 hours in air.

The silvery, shiny drops obtained in this way are placed in an insert mould and oversprayed with liquid polycarbonate.

The sample obtained shows that the shape of the silvery, shiny drops did not alter optically under the effects of the high pressure and high temperatures prevailing during insert moulding, so the ink described in Example 6 is also suitable for use in an insert moulding process.

We claim:

1. A process for preparing a silver-containing, disperse, water-containing formulation containing at least
    a) 0.5 to 30 parts by wt. of silver metal particles with an effective diameter of at most 150 nm with a bimodal size distribution of the silver metal particles, determined using laser correlation spectroscopy,
    b) 50 to 99.5 parts by wt. of water and optionally up to 30 parts by wt. of solvent,
    c) 0.01 to 10 parts by wt. of at least one polymeric, dispersant,
    d) 0 to 5 parts by wt. of film-producer,
    e) 0 to 5 parts by wt. of additives,
    f) 0 to 5 parts by wt. of conductive polymers, said formulation having a viscosity of at most 150 mPa·s,
    comprising the steps of
    i) reacting a silver salt solution with a solution containing hydroxide ions, wherein at least one of said solutions comprises a polymeric dispersant, to produce an $Ag_2O$ sol,
    ii) reacting the $Ag_2O$ sol obtained from step i) with a reduction agent,
    iii) purifying the solution obtained from step ii) by centrifugation or membrane filtration.

2. The process of claim 1, wherein said silver salt is silver nitrate and said hydroxide is sodium hydroxide.

3. The process of claim 1, where said reducing agent is an aqueous formaldehyde solution.

4. The process of claim 1, wherein said purification is by membrane filtration.

5. The process of claim 1, wherein said dispersant is at least one agent selected from the group consisting of polyvinyl alcohols, copolymers of polyvinyl alcohols and polyvinyl acetates, polyvinylpyrrolidones, cellulose, starch, gelatine, gelatine derivatives, polymers of amino acids, polylysine, polyaspartic acid, polyacrylates, polyethylene sulfonates, polystyrene sulfonates, polymethacrylates, condensation products of aromatic sulfonic acids and formaldehyde, naphthalene sulfonates, lignin sulfonates, copolymers of acrylic monomers, polyethylenimines, polyvinylamines, polyallylamines, poly(2-vinylpyridines), block copolyethers, block copolyethers with polystyrene blocks, polydiallyldimethylammonium chloride and combinations thereof.

6. The process of claim 1, wherein after step ii) but before step iii), particles are separated from the solution.

7. The process of claim 6 wherein said particles are separated from said solution by diafiltration.

* * * * *